United States Patent [19]

Yamada

[11] Patent Number: 4,980,261
[45] Date of Patent: Dec. 25, 1990

[54] IMAGE-FORMING METHOD EMPLOYING LIGHT-SENSITIVE MATERIAL AND IMAGE-RECEIVING MATERIAL

[75] Inventor: Makoto Yamada, Minami-ashigara, Japan

[73] Assignee: Fuji Photo Film Co., Ltd., Kanagawa, Japan

[21] Appl. No.: 249,221

[22] Filed: Sep. 26, 1988

Related U.S. Application Data

[63] Continuation of Ser. No. 24,495, Mar. 11, 1987, abandoned.

[30] Foreign Application Priority Data

Mar. 11, 1986 [JP] Japan .................................. 61-52990

[51] Int. Cl.$^5$ ........................... G03C 1/68; G03C 1/72
[52] U.S. Cl. ..................................... 430/138; 430/203; 430/253; 430/254; 430/330; 430/351
[58] Field of Search ............... 430/199, 203, 253, 254, 430/292, 330, 351, 138

[56] References Cited

U.S. PATENT DOCUMENTS

| | | | |
|---|---|---|---|
| 3,060,022 | 10/1962 | Duerr | 430/199 |
| 4,504,571 | 3/1985 | Yamamura et al. | 430/253 |
| 4,624,910 | 11/1986 | Takeda | 430/203 |
| 4,629,676 | 12/1986 | Hayakawa et al. | 430/203 |

Primary Examiner—Paul R. Michl
Assistant Examiner—Patrick A. Doody
Attorney, Agent, or Firm—Sughrue, Mion, Zinn, Macpeak & Seas

[57] ABSTRACT

An image-forming method which comprises:

imagewise exposing a light-sensitive material comprising a light-sensitive layer which contains silver halide, a reducing agent and a polymerizable compound provided on a support to form a latent image of the silver halide;

simultaneously or thereafter developing the light-sensitive material to polymerize the polymerizable compound within the area where the latent image of the silver halide has been formed; and pressing the light-sensitive material on an image-receiving material having a porous support which has such a surface characteristic that a filtered maximum waviness of not less than 4 μm is observed in not more than 10 positions among 100 positions which are determined at random on a filtered waviness curve, to transfer the unpolymerized polymerizable compound to the image-receiving material.

The filtered maximum waviness is determined within basic length of 2.5 mm extracted from the filtered waviness curve which is obtained from the profile of the porous support under the condition of the cut-off value of 0.8 mm according to JIS-B-0610.

20 Claims, 1 Drawing Sheet

IMAGE-FORMING METHOD EMPLOYING LIGHT-SENSITIVE MATERIAL AND IMAGE-RECEIVING MATERIAL

This is a continuation of application Ser. No. 024,495, filed Mar. 11, 1987, now abandoned.

BACKGROUND OF THE INVENTION

1. Field of the Invention

This invention relates to an image-forming method utilizing a light-sensitive material comprising a light-sensitive layer containing silver halide, a reducing agent and a polymerizable compound provided on a support and an image-receiving material.

2. Description of Prior Art

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143 describe image-forming methods unilizing light-sensitive materials comprising a light-sensitive layer containing silver halide, a reducing agent and a polymerizable compound provided on a support. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In the method, when the material is heated, the reducing agent functions as polymerization inhibitor within the area where a latent image of the silver halide has been formed, and the polymerizable compound within the other area is polymerized.

Further, Japanese Patent Provisional Publication No. 61(1986)-73145 (corresponding to U.S. Pat. No. 4,629,676 and European Patent Provisional Publication No. 0174634A2) describes an embodiment of the image-forming methods which comprises: imagewise exposing a light-sensitive material comprising a light-sensitive layer provided on a support wherein the light-sensitive layer contains silver halide, a reducing agent and a polymerizable compound; simultaneously or thereafter developing the light-sensitive material; and pressing the light-sensitive material on an image-receiving material to transfer the unpolymerized polymerizable compound to the image-receiving material.

As the support of the image-receiving material, a porous sheet is frequently employed, because the porous sheet is light-weight and the unpolymerized polymerizable compound is well fixed on the image-receiving material having the porous sheet. In the case that the unpolymerized polymerizable compound is transferred to the image-receiving material employing the porous support from the light-sensitive material under certain conditions, low density spots of diameter of about 10 $\mu$m to about 1 mm containing an extremely small amount of the unpolymerized polymerizable compound are sometimes formed on the image-receiving material within the area where the polymerizable compound should be placed.

The above spot can be minimized by employing a thick sheet as the support, but the thick image-receiving material is not preferred in consideration of handling in the image formation, space required for the storage of the material and the cost for preparation thereof. Alternatively, the above spot can be also minimized when the image is transfered under high pressure, but it brings about requirement that the pressure device should be more powerful than the conventional one to obtain such high pressure.

SUMMARY OF THE INVENTION

An object of the present invention is to provide an image-forming method which is minimized or reduced in the occurrence of the above low-density spot in the image formation.

There is provided by the present invention an image-forming method which comprises:

imagewise exposing a light-sensitive material comprising a light-sensitive layer which contains silver halide, a reducing agent and a polymerizable compound provided on a support to form a latent image of the silver halide;

simultaneously or thereafter developing the light-sensitive material to polymerize the polymerizable compound within the area where the latent image of the silver halide has been formed (or the area where the latent image of the silver halide has not been formed);

and pressing the light-sensitive material on an image-receiving material having a porous support which has such a surface characteristic that a filtered maximum waviness of not less than 4 $\mu$m is observed in not more than 10 positions among 100 positions which are determined at random on a filtered waviness curve, to transfer the unpolymerized polymerizable compound to the image-receiving material.

The filtered maximum waviness is determined within basic length of 2.5 mm extracted from the filtered waviness curve which is obtained from the profile of the porous support under the condition of the cut-off value of 0.8 mm according to JIS-B-0610.

The image-forming method of the invention is characterized in employing an image-receiving material having a porous support which has such a surface characteristic that a filtered maximum waviness of not less than 4 μm is observed in not more than 10 positions among 100 positions which have been chosen at random on the filtered waviness curve.

The present inventor has found that the above-mentioned low-density spot which occurs on a transferred image obtained on the image-receiving material employing a porous support can be much minimized or reduced by increasing the surface smoothness of the porous support on the side to which the unpolymerized polymerizable compound is transferred.

In the image-receiving material employed in the invention, the porous support has the above-defined smooth surface characteristic. Therefore, the image-forming method gives an improved clear image in which the occurrence of the above low-density spot in the image formation is much minimized or reduced. Further, the image-forming method of the invention has an advantage of more easily and inexpensively solving the problem with respect to the low-density spot, as compared with the measures employing a thick porous support or a powerful pressure device.

DETAILED DESCRIPTION OF THE INVENTION

Figure 1:
FIG. 1 represents a portion of a typical profile curve of a porous support.

As indicated, the filtered maximum waviness is determined within a basic length of 2.5 mm extracted from the filtered waviness curve which is obtained from the profile of the porous support under the condition of a cut-off value of 0.8 mm according to JIS B 0610.

This Japanese Industrial Standard specifies the system of representation of surface waviness by filtered maximum waviness ($W_{CM}$). To determine surface waviness, arithmetic averages of values of $W_{CM}$ measured at several positions are chosen at random on a machine surface. The profile is a contour which is presented on a sectional plane, when a surface to be measured has been cut in a plane perpendicular to the mean surface of the surface to be measured.

The image-forming method of the present invention employs an porous sheet as the support of the image-receiving material. Examples of the porous sheet include not only a paper (including a coated paper and a synthetic paper), but also a non-woven fabric, a woven fabric and a knitted fabric.

In the present invention, the porous support of the image-receiving material has such a surface characteristic at least on the side to which the unpolymerized polymerizable compound is transferred that a filtered maximum waviness of not less than 4 μm is observed in not more than 10 positions among 100 positions which have been chosen at random on the filtered waviness curve. The filtered maximum waviness is determined within basic length of 2.5 mm extracted from the filtered waviness curve which is obtained from the profile (namely profile curve) of the porous support under the condition of the cut-off value of 0.8 mm according to JIS-B-0610.

The profile curve means a contour which is presented on a sectional plane, when a surface to be measured has been cut by a plane perpendicular to the means surface of the surface to be measured. The filtered waviness curve is a curve obtained by removing the short wave length components of surface roughness by a low band filter from the profile curve. The cut-off value means a wave length corresponding to the frequency at which its gain becomes 70% when a low-pass filter of attenuation rate of −12 dB/oct is used, in the case where the filtered waviness curve is to be obtained. Further, the filtered maximum waviness ($W_{CM}$) means a maximum height of wave of a portion within the basic length (L) extracted from the filtered waviness curve, expressed in micrometer unit (μm).

The filtered maximum waviness with a high band cut-off value is herein used as the expression of the unevenness (or smoothness) on the surface of a support, because the occurrence of the above-mentioned low-density spot is scarcely influenced by the unevenness in which the wavelength is shorter than 0.8 mm. The present inventor has determined that the basic length is 2.5 mm, because the occurrence of the above-mentioned low-density spot is also scarcely influenced by the unevenness in which the wavelength is longer than 2.5 mm. These tendencies are remarkable in the case that the thickness of the support is not more than 100 μm.

These definitions are further described hereinafter by referring to the accompanying drawings.

FIG. 1 represents a part of a typical profile of a porous support. The profile has been obtained by the stylus method according to JIS-B-0610 on a support made of a fibrous material.

Figure 2:
FIG. 2 represents a part of a typical filtered waviness curve which is obtained from the profile curve shown in FIG. 1.

FIG. 2 represents a part of a typical filtered waviness curve which is obtained using a low band filter having a cut-off value of 0.8 mm from the profile shown in FIG. 1.

Figure 3:
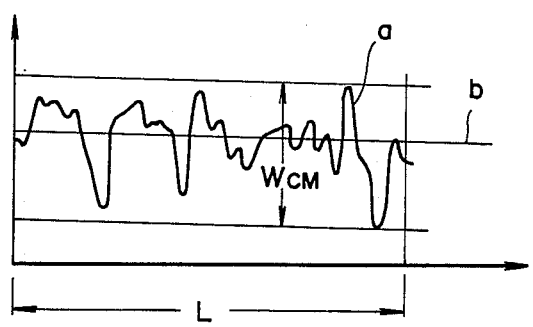
FIG. 3 is given to illustrate the method for the determination of the filtered maximum waviness.

FIG. 3 is given to explain the method for the determination of the filtered maximum waviness in which the (L) is the basic length. As shown in FIG. 3, the part having the length (L) is extracted at random form the filtered waviness curve (a), and the mean line (b) is determined within the above part of the filtered waviness curve. The mean line (b) is a straight line at which the total square of the difference between the straight line and the filtered waviness curve becomes smallest. The filtered maximum waviness ($W_{CM}$) means the sum of the differences between the wave height of the highest wave and the mean line and between the wave height of the lowest wave and the mean line.

The image-forming method of the invention is characterized in empolying an image-receiving material having the porous support which has such a surface characteristic at least on the side to which the unpolymerized polymerizable compound is transferred that when a filtered maximum waviness is thus measured in 100 positions which have been chosen at random on the filtered waviness, the filtered maximum waviness of not less than 4 μm is observed in not more than 10 positions. More preferably, the filtered maximum waviness of not less than 4 μm is observed in not more than 5 positions.

The image-receiving material employed in the invention uses a porous sheet having the above mentioned surface characteristic as the support. This porous sheet is commercially available. Otherwise the porous sheet can be prepared from a conventional porous sheet with an adequate treatment.

A pressure treatment, such as calendering can give the surface characteristic to the generally available porous sheet. More generally, the surface characteristic can be given to the porous sheet by coating a paint on one side or both sides of the sheet.

For example, a coated porous paper can be used as the support of the image-receiving material employed in the invention. The coated paper is generally obtained by coating a paint, in which a mineral pigment (e.g., China clay) and an adhesive (e.g., casein, starch, latex, polyvinyl alcohol and the mixture thereof) is mixed, on one side or both sides of a base paper (e.g., wood free paper, fine paper). The coated paper can be classified into an art paper (amount of the coated paint; about 20 g/m$^2$), a coat paper (about 10 g/m$^2$) and a lightweight coated paper (about 5 g/m$^2$) according the amount of the coated paint. Further, the coated paper include a cast-coated paper which shows a strong gross given by pressing the coated surface on a specular face of a drier while the plasticity of the coated paint still remains. Details of the coated paper are described in "Handbook of Paper and Pulp Technology" editted by the Assosiation for paper and pulp technology in Japan (1982), pp. 415, 535–536. Among the coated papers, the cast-coat paper is most preferred.

The coated paper preferably has a basis weight of from 20 g/m$^2$ to 200 g/m$^2$, more preferably from 50 g/m$^2$ to 100 g/m$^2$.

Typical example of the porous sheet having the above mentioned surface characteristic without any treatment is a synthetic paper. The synthetic paper is generally obtained by forming a synthetic high polymer compound to have properties of paper. Examples of the synthetic papers include a synthetic fiber paper and a plastic film paper. The method for the preparation of the synthetic paper is classified into a fiber base method and a film base method according to the form of the low material. The film base method is classified into a coating method, a solvent treating method in which etching is employed, an emboss method and a blend method in which an opaque pigment is employed, according to the treatment process.

The image-receiving material is usually prepared by providing the image-receiving layer on the above mentioned porous support. The image-receiving layer can be constructed according to the color formation system. In the cases that a polymer image is formed on the image-receiving material and that a dye or pigment is employed as the color image forming substance, the image-receiving material be composed of a simple porous support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer can further contain the other optional components, such as a binder, a dye, a pigment, a thermal polymerization initiator and a photopolymerization initiator.

The image-receiving layer preferably contains a polymer as a binder, so long as the grains of the thermoplastic compound are not adhesive. Binders employable in the image-receiving layer preferably are transparent or semi-transparent hydrophilic binders. Examples of the binders include natural substances such as gelatin, gelatin derivatives, cellulose derivatives (e.g., carboxymethylcellulose, methylcellulose), starch, and gum arabic; and synthetic polymeric substances, such as water-soluble polyvinyl compounds (e.g., polyvinylalcohol, polyvinylpyrrolidone, and acrylamide polymers). These binders can be used singly or in combination.

When a white pigment, such as titanium dioxide or barium sulfate, is contained in the image-receiving layer, the image-receiving layer can function as a white reflection layer. In this case, the white pigment is used in amount of from 10 g to 100 g based on 1 g of the thermoplastic compound.

The image-receiving layer can be composed of two or more layers according to the above-mentioned functions. The thickness of the image-receiving layer preferably ranges from 5 to 50 μm, more preferably from 5 to 40 μm. In the case that the porous support is a coated paper, a smooth surface characteristic can be obtained on the image-receiving layer, because the coated paper (especially cast-coated paper) has a very smooth surface characteristic even if a thin paper is employed as the base paper of the coated paper.

The image-receiving material can be prepared by dissolving, emulsifying or dispersing each of the components of the image-receiving layer in an adequate medium to obtain coating solution, and then coating the obtained coating solution on the porous support.

The imagewise exposure of the light-sensitive material, the development process and the transference of the unpolymerized polymerizable compound to the image-receiving material in the image-forming method of the invention are described below.

Various exposure means can be employed in the image-wise exposure, and in general, the latent image on the silver halide is obtained by imagewise exposure to radiation including visible light. The type of light source and exposure conditions can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means. The heating temperature for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound within the area where a latent image of the silver halide has been formed or the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized in the same manner as the light-sensitive material described in Japanese Patent Provisional Publication No. 61(1986)-260241.

After the development process, pressing the light-sensitive material on the image-receiving material to transfer the unpolymerized polymerizable compounds to the image-receiving material, a polymer image can be obtained in the image-receiving material. The process for pressing can be carried out in various known manners. The pressure in the process for pressing preferably ranges from 50 kg/cm² to 1,000 kg/cm², more preferably ranges from 100 kg/cm² to 700 kg/cm².

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

The image-forming method can be used for monochromatic or color photography, printing, radiography, diagnosis (e.g., CRT photography of diagnostic device using supersonic wave), copy (e.g., computer-graphic hard copy), etc.

The light-sensitive material which can be used for the image-forming method of the invention are described below. The light-sensitive material used in the invention comprises a light-sensitive layer containing silver halide, a reducing agent and a polymerizable compound provided on a support. Thus composed material is referred hereinafter to as "light-sensitive material".

There is no specific limitation with respect to silver halide contained in the light-sensitive layer of the light-sensitive material.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 1 g/m², more preferably in the range of from 1 mg to 500 mg/m².

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the portion where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291–334 (1977), Research Disclosure No. 17029, 9–15 (June 1978), and Research Disclosure No. 17643, 22–31 (December 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N- methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentyl-phenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively high boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

In the case that the support of the light-sensitive material is a porous support, the porous support preferably has such a surface characteristic that a filtered maximum waviness of not less than 4 μm is observed in not more than 20 positions among 100 positions which are determined at random on a filtered waviness curve similarly to the porous support of the image-receiving material.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

The oil droplets of the polymerizable compound are preferably prepared in the form of microcapsules. There is no specific limitation on preparation of the microcapsules. There is also no specific limitation on shell material of the microcapsule, and various known materials such as polymers which are employed in the conventional microcapsules can be employed as the shell material. The mean size of the microcapsule preferably ranges from 0.5 to 50 μm, more preferably 1 to 25 μm, most preferably 3 to 20 μm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigmentprecursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", 26–32 (Jun., 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —SO$_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, dititanium oxide or aluminum oxid described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an a heating layer, an antistatic layer, an anticurl layer and a release layer.

The light-sensitive material employing the heating layer is described in Japanese Patent Application No. 60(1985)-135568. Examples and usage of the other auxiliary layers are also described in the above-mentioned publications and applications concerning the light-sensitive material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation of physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using ureaformaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A light-sensitive material can be prepared by coating and drying the above-prepared coating solution on a support in the conventional manner.

The present invention is further described by the following examples without limiting the invention.

EXAMPLE 1

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% aqueous slurry of calcium carbonate, followed by coarsely dispersing in a mixer. The coarse dispersion was then finely dispersed in Dynomile dispersing device. To 200 g of the resulting dispersion were added 6 g of 50% latex of SBR (styrene-butadiene rubber) and 55 g of 8% aqueous solution of polyvinyl alcohol, and the resulting mixture was made homogenous to prepare a coating solution.

Polyethylene films (thickness: 15 μm), in which particles of titanium dioxide are dispersed, are laminated on both sides of a paper (support (a): details are set forth in Table 1). The coating solution was then uniformly coated on the above laminated support to give a layer having a wet thickness of 30 μm and dried to obtain an image-receiving material (A).

EXAMPLE 2

Preparation of image-receiving material

Image-receiving materials (B) and (C) were prepared in the same manner as in Example 1, except that the paper supports (b) and (c) set forth in Table 1 were used, respectively, in place of the support (a).

COMPARISON EXAMPLE 1

Preparation of image-receiving material

An image-receiving material (D) was prepared in the same manner as in Example 1, except that the paper support (d) (details are set forth in Table 1) was used in place of the support (a).

COMPARISON EXAMPLE 2

Preparation of paper support of image-receiving material

In a disk refiner, 70 parts of LBKP and 30 parts of NBKP were beated to obtain a pulp having a Canadian standard freeness of 350 cc. To the resulting pulp were added 5.0 parts of talc, 1.5 parts of rosin, 2.0 parts of aluminium sulfate and 0.5 part of polyamide-polyamineepichlorhydrin to obtain a paper stuff, in which the part is a dry weight ratio to the pulp. A paper support (e) (details are set forth in Table 1) was made from the obtained paper stuff in Fourdrinier paper machine.

Preparation of image-receiving material

An image-receiving material (E) was prepared in the same manner as in Example 1, except that the paper support (e) was used in place of the support (a).

EXAMPLE 3

Preparation of paper support of image-receiving material

In a disk refiner, 70 parts of LBKP and 30 parts of NBKP were beated to obtain a pulp having a Canadian standard freeness of 350 cc. To the resulting pulp were added 5.0 parts of talc, 1.5 parts of rosin, 2.0 parts of aluminium sulfate and 0.5 part of polyamide-polyamineepichlorhydrin to obtain a paper stuff, in which the part is a dry weight ratio to the pulp. A fine paper having a basis weight of 69.0 g/m² was made from the obtained paper stuff in Fourdrinier paper machine.

On the fine paper was coated a mixture of 100 parts of starch, 30 parts of polyvinyl alcohol and 400 parts of clay to give a layer having a weight of 15 g/m². Thus, a paper support (f) (details are set forth in Table 1) was obtained.

Preparation of image-receiving material

An image-receiving material (F) was prepared in the same manner as in Example 1, except that the paper support (f) was used in place of the support (a).

TABLE 1

| Support | Kind of Paper | Basis Weight | Number of $W_{CM}$* |
|---|---|---|---|
| (a) | Coat paper | 84.9 g/m₂ | 7–8 |
| (b) | Cast-coated paper | 84.9 g/m₂ | 1–5 |
| (c) | Synthetic paper | 81.6 g/m₂ | 1–5 |
| (d) | Wood free paper | 84.3 g/m₂ | 91 |
| (e) | Fine paper | 84.0 g/m₂ | 87 |
| (f) | Coat paper | 84.0 g/m₂ | 6–7 |

Remark: "Number of $W_{CM}$" means the number of the filtered maximum waviness of not less than 4 μm, when the filtered maximum waviness is measured at each of 100 positions according to the present invention.

Preparation of silver halide emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. to obtain the silver halide emulsion. The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. An excessive salt was sedimented by pH-adjustment and removed from the resulting emulsion. Thereafter, the emulsion was adjusted to pH 6.30 to obtain a silver benzotriazole emulsion. The yield of the emulsion was 400 g.

Preparation of light-sensitive composition

In 100 g of pentaerythritol tetraacrylate were dissolved 0.40 g of the following copolymer, 6.00 g of Pargascript Red I-6-B (tradename, Chiba-Geigy) and 2 g of Emulex NP-8 (tradename, preduced by Nippon Emulsion Co., Ltd.).

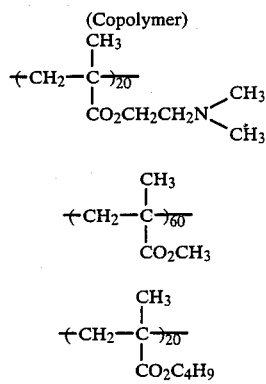

In 18.0 g of the resulting solution was dissolved 0.002 g of the following thiol derivative. To the solution was added a solution in which 0.16 g of the following reducing agent (I) and 1.22 g of the following reducing agent (II) were dissolved in 1.80 g of methylene chloride.

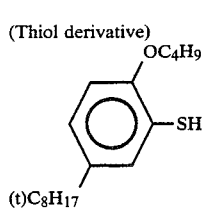

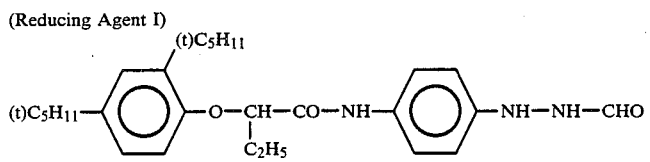

(Reducing Agent II)

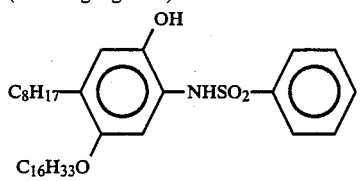

Further, to the resulting solution were added 3.50 of the silver halide emulsion and 3.35 g of the silver benzotriazole emulsion, and the mixture was stirred at 15,000 r.p.m. for 5 min. using a homogenizer to obtain a light-sensitive composition.

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to pH 4.0 using 10% solution of sulfuric acid, the light-sensitive composition was added to the resulting solution, and the mixture was stirred at 7,000 r.p.m. for 2 min. using a homogenizer to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 3.00 g of 8.00% aqueous solution of ammonium sulfate in this order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 volume ratio) of guanidine trichroloacetate to prepare a coating solution.

(Anionic surfactant)

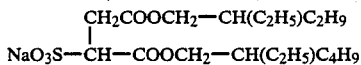

The coating solution was uniformly coated on a polyethylene terephthalate film (thickness: 100 μm) using a coating rod of #40 to give a layer having a wet thickness of 70 μm and dried at about 40° C. to obtain a light-sensitive material.

Image formation on image-receiving material

The light-sensitive material was uniformly exposed to light, using a tungsten lamp at 60 lux for 1 second and then heated on a hot plate at 125° C. for 40 seconds. The exposed and heated light-sensitive material was then combined with each of the image-receiving materials prepared in Examples 1, 2 & 3 and Comparison Examples 1 & 2, and passed through press rolls under pressure of 250 kg/cm$^2$ or 700 kg/cm$^2$ to obtain a magenta positive image on the image receiving material. The number of the low-density spots on the obtained image was observed with the naked eye.

The results are set forth in Table 2. In Table 2, each of the value represents number of the low-density spots observed with in the area of 1 cm$^2$.

TABLE 2

| Image-Receiving Material | Paper Support | Number of low-density spots (Pressure) | |
|---|---|---|---|
| | | 250 kg/cm$^2$ | 700 kg/cm$^2$ |
| (A) | (a) | 30–60 | 10–30 |
| (B) | (b) | 20–50 | 10–30 |
| (C) | (c) | 20–50 | 10–30 |
| (D) | (d) | 100–300 | 50–100 |
| (E) | (e) | 95–285 | 50–100 |
| (F) | (f) | 25–57 | 10–30 |

It is apparent from the results in Table 2 that each of the image-receiving materials (A), (B), (C) and (F) is remarkably reduced in the occurrence of the low-density spot.

Further, an image-receiving material employing a paper which is not laminated with the polyethylene film was also remarkably reduced in the occurrence of the low-density spot, so long as the paper has a surface characteristic according to the invention.

What is claimed:

1. An image-forming method which comprises:
   imagewise exposing a light-sensitive material comprising a light-sensitive layer which contains silver halide grains, a reducing agent and an ethylenically unsaturated polymerizable compound provided on a support, said silver halide grains and ethylenically unsaturated compound being contained in microcapsules wherein the silver halide grains are contained in the shell of the microcapsules, said microcapsules being dispersed in the light-sensitive layer, to form a latent image of the silver halide;
   simultaneously or thereafter developing the light-sensitive material to polymerize the polymerizable compound within the area where the latent image of the silver halide has been formed; and
   pressing the light-sensitive material on an image-receiving material having a porous support which has such a surface characteristic that a filtered maximum waviness of not less than 4 μm is observed in not more than 10 positions among 100 positions which are determined at random on a filtered waviness curve, the filtered maximum waviness being determined with a basic length of 2.5 mm extracted from the filtered waviness curve which is obtained from the profile of the porous support under the condition of the cut-off value of 0.8 mm according to JIS-B-0610, to transfer the unpolymerized polymerizable compound to the image-receiving material.

2. The image-forming method as claimed in claim 1, wherein the development is done by a heat development process.

3. The image-forming method as claimed in claim 1, wherein the development is done by a heat development process and the heat temperature in the heat development process is from 80° C. to 200° C.

4. The image-forming method as claimed in claim 1, wherein the light-sensitive material is pressed on the image-receiving material under a pressure of from 50 kg/cm² to 1,000 kg/cm².

5. The image-forming method as claimed in claim 1, wherein the porous support of the image-receiving material has such a surface characteristic that a filtered maximum waviness of not less than 4 μm is observed in not more than 5 positions among 100 positions which are determined at random on the filtered waviness curve.

6. The image-forming method as claimed in claim 1, wherein the porous support of the image-receiving material has a thickness of not more than 100 μm.

7. The image-forming method as claimed in claim 1, wherein the porous support of the image-receiving material is a coated paper or a cast-coated paper.

8. The image-forming method as claimed in claim 1, wherein the porous support of the image-receiving material is a synthetic paper.

9. The light-forming method as claimed in claim 1, wherein the image-receiving material comprises a image-receiving layer containing a polymer provided on the porous support.

10. An image-forming method which comprises:
imagewise exposing a light-sensitive material comprising a light-sensitive layer which contains silver halide grains, a reducing agent and an ethylenically unsaturated polymerizable compound provided on a support, said silver halide grains and ethylenically unsaturated compound being contained in microcapsules wherein the silver halide grains are in the shell of microcapsules, said microcapsules being dispersed in the light-sensitive layer, to form a latent image of the silver halide;
simultaneously or thereafter developing the light-sensitive material to polymerize the polymerizable compound within the area where the latent image of the silver halide has not been formed; and
pressing the light-sensitive material on an image-receiving material having a porous support which has such a surface characteristic that a filtered maximum waviness of not less than 4 μm is observed in not more than 10 positions among 100 positions which are determined at random on a filtered waviness curve, the filtered maximum waviness being determined within a basic length of 2.5 mm extracted from the filtered waviness curve which is obtained from the profile of the porous support under the condition of the cut-off value of 0.8 mm according to JIS-B-0610, to transfer the unpolymerized polymerizable compound to the image-receiving material.

11. The image-forming method as claimed in claim 10, wherein the development is done by a heat development process.

12. The image-forming method as claimed in claim 10, wherein the development is done by a heat development process and the heat temperature in the heat development process is from 80° C. to 200° C.

13. The image-forming method as claimed in claim 10, wherein the light-sensitive material is pressed on the image-receiving material under a pressure of from 50 kg/cm² to 1,000 kg/cm².

14. The image-forming method as claimed in claim 10, wherein the porous support of the image-receiving material has such a surface characteristic that a filtered maximum waviness of not less than 4 μm is observed in not more than 5 positions among 100 positions which are determined at random on the filtered waviness curve.

15. The image-forming method as claimed in claim 10, wherein the porous support of the image-receiving material has a thickness of not more than 100 μm.

16. The image-forming method as claimed in claim 10, wherein the porous support of the image-receiving material is a coated paper or a cast-coated paper.

17. The image-forming method as claimed in claim 10, wherein the porous support of the image-receiving material is a synthetic paper.

18. The light-forming method as claimed in claim 10, wherein the image-receiving material comprises a image-receiving layer containing a polymer provided on the porous support.

19. The image-forming method claimed in claim 1, wherein the support of the light-sensitive material is a porous support.

20. The image-forming method as claimed in claim 10, wherein the support of the light-sensitive material is a porous support.

* * * * *